(12) United States Patent
Lim et al.

(10) Patent No.: US 9,054,077 B2
(45) Date of Patent: Jun. 9, 2015

(54) PACKAGE HAVING SPACED APART HEAT SINK

(75) Inventors: Ken Beng Lim, Bayan Lepas (MY); Teik Tiong Toong, Siam (MY)

(73) Assignee: Altera Corporation, San Jose, CA (US)

( * ) Notice: Subject to any disclaimer, the term of this patent is extended or adjusted under 35 U.S.C. 154(b) by 70 days.

(21) Appl. No.: 12/721,486

(22) Filed: Mar. 10, 2010

(65) Prior Publication Data

US 2011/0221048 A1 Sep. 15, 2011

(51) Int. Cl.
| | |
|---|---|
| *H01L 23/02* | (2006.01) |
| *H01L 23/433* | (2006.01) |
| *H01L 23/495* | (2006.01) |
| *H01L 23/31* | (2006.01) |
| *H01L 23/00* | (2006.01) |

(52) U.S. Cl.
CPC ......... *H01L 23/4334* (2013.01); *H01L 23/3107* (2013.01); *H01L 23/49503* (2013.01); *H01L 24/48* (2013.01); *H01L 24/85* (2013.01); *H01L 2224/48091* (2013.01); *H01L 2224/48247* (2013.01); *H01L 2224/48257* (2013.01); *H01L 2924/14* (2013.01); *H01L 2224/85* (2013.01)

(58) Field of Classification Search
CPC ...................... H01L 23/4334; H01L 23/49503
USPC ............ 257/675, E23.031, E21.502, E21.506
See application file for complete search history.

(56) References Cited

U.S. PATENT DOCUMENTS

| | | | | |
|---|---|---|---|---|
| 5,053,855 A | * | 10/1991 | Michii et al. ................... | 257/675 |
| 5,147,821 A | * | 9/1992 | McShane et al. ......... | 264/272.17 |
| 5,430,331 A | * | 7/1995 | Hamzehdoost et al. ....... | 257/796 |
| 5,442,234 A | * | 8/1995 | Liang ............................. | 257/675 |
| 5,444,909 A | * | 8/1995 | Mehr .............................. | 29/827 |
| 5,598,034 A | * | 1/1997 | Wakefield ...................... | 257/706 |
| 5,698,899 A |  | 12/1997 | Kirakawa et al. | |
| 5,719,442 A | * | 2/1998 | Otsuki .......................... | 257/712 |
| 5,859,471 A | * | 1/1999 | Kuraishi et al. ............... | 257/666 |
| 5,872,395 A | * | 2/1999 | Fujimoto ...................... | 257/675 |
| 5,973,407 A | * | 10/1999 | Tzu et al. ....................... | 257/796 |

(Continued)

FOREIGN PATENT DOCUMENTS

| | | |
|---|---|---|
| CN | 1264174 | 8/2000 |
| JP | 60137041 | * 7/1985 |

(Continued)

OTHER PUBLICATIONS

JP 2005-033123A (Mitsubishi Electric Co.) Feb. 3, 2005 (Abstract) [Online] Thomas Innovation, Retrieved From Thomson Innovation, p. 1-2.

(Continued)

*Primary Examiner* — David S Blum
(74) *Attorney, Agent, or Firm* — Womble Carlyle Sandridge & Rice LLP

(57) ABSTRACT

An integrated circuit (IC) package that includes a lead frame, and a die affixed to a first surface of a pad of the lead frame. The die is wire bonded to the lead frame. The package includes a heat sink spaced apart from a second surface of the pad, where the second surface opposes the first surface. Molding compound encapsulates the lead frame and the die. The molding compound is disposed between the heat sink and the second surface of the pad and is enabled access between the heat sink and the second surface through protruding features disposed on the heat sink, the second surface, and/or some combination of the two.

19 Claims, 5 Drawing Sheets

(56) References Cited

U.S. PATENT DOCUMENTS

| | | | |
|---|---|---|---|
| 6,046,496 A * | 4/2000 | Corisis et al. | 257/675 |
| 6,081,028 A * | 6/2000 | Ettehadieh et al. | 257/713 |
| 6,258,630 B1 * | 7/2001 | Kawahara | 438/122 |
| 6,407,411 B1 * | 6/2002 | Wojnarowski et al. | 257/99 |
| 6,495,881 B1 * | 12/2002 | Ahmed et al. | 257/316 |
| 6,583,499 B2 * | 6/2003 | Huang et al. | 257/666 |
| 6,713,864 B1 * | 3/2004 | Huang | 257/712 |
| 7,132,315 B2 * | 11/2006 | Minamio et al. | 438/123 |
| 7,196,904 B2 * | 3/2007 | Ku | 361/703 |
| 7,635,613 B2 * | 12/2009 | Lange et al. | 438/123 |
| 7,714,455 B2 * | 5/2010 | Son et al. | 257/787 |
| 7,777,320 B2 * | 8/2010 | Merilo et al. | 257/685 |
| 7,858,443 B2 * | 12/2010 | Powell et al. | 438/111 |
| 7,902,648 B2 * | 3/2011 | Lee | 257/676 |
| 2001/0045644 A1 * | 11/2001 | Huang | 257/718 |
| 2002/0063315 A1 * | 5/2002 | Huang et al. | 257/666 |
| 2002/0117764 A1 * | 8/2002 | Huang | 257/796 |
| 2003/0075783 A1 * | 4/2003 | Yoshihara et al. | 257/675 |
| 2003/0183907 A1 * | 10/2003 | Hayashi et al. | 257/666 |
| 2004/0099933 A1 * | 5/2004 | Kimura | 257/675 |
| 2006/0103008 A1 * | 5/2006 | Ong et al. | 257/706 |
| 2006/0175689 A1 * | 8/2006 | Shim et al. | 257/675 |
| 2007/0034994 A1 * | 2/2007 | Choi | 257/666 |
| 2007/0108565 A1 * | 5/2007 | Shim et al. | 257/676 |
| 2008/0032456 A1 * | 2/2008 | Ahn et al. | 438/124 |
| 2009/0194858 A1 * | 8/2009 | Youn et al. | 257/676 |
| 2011/0012264 A1 * | 1/2011 | Linderman et al. | 257/773 |

FOREIGN PATENT DOCUMENTS

| | | | |
|---|---|---|---|
| JP | 61166051 | * | 7/1985 |
| JP | 61166051 | * | 7/1986 |
| JP | 363077142 | * | 4/1988 |
| JP | 04114455 | * | 4/1992 |
| JP | 08008388 | * | 1/1996 |
| JP | 10-242347 A | | 9/1998 |
| JP | 2005-033123 A | | 2/2005 |

OTHER PUBLICATIONS

JP 10-242347A (Oki Electric Inc. Co., Ltd.) Sep. 11, 1998 (Abstract) [Online] Thomson Innovation, Retrieved From Thomson Innovation, p. 1.

State Intellectual Property Office, Office Action for CN 201180013333.2, dated Oct. 10, 2014.

* cited by examiner

PACKAGE HAVING SPACED APART HEAT SINK

BACKGROUND

Current wire bonding packages provide for a heat sink that is disposed, i.e., "dropped in," against a die paddle of the lead frame. In such a package there is no adhesion between the die paddle and the heat sink. However, the molding compound cannot penetrate the area between the die paddle and the heat sink in this configuration. The lack of molding compound in this area increases the thermal resistance of the package and creates internal stresses within the package due to expansion forces in the area between the die paddle and the heat sink. In addition, as the die size and die paddle size increase, these expansion forces create even more internal stress within the package. The constant exposure to these internal stresses can eventually cause delamination, which can lead to failure of the device.

It is within this context that the embodiments described below arise.

SUMMARY

The embodiments described herein provide a package for an integrated circuit having enhanced structural integrity. It should be appreciated that the present invention can be implemented in numerous ways, such as a process, an apparatus, a system, a device or a method. Several inventive embodiments of the present invention are described below.

In one aspect of the invention, an integrated circuit (IC) package that includes a lead frame and a die affixed to a first surface of a pad of the lead frame. The die is wire bonded to the lead frame. The package includes a heat sink spaced apart from a second surface of the pad, where the second surface opposes the first surface. Molding compound encapsulates the lead frame and the die. The molding compound is disposed between the heat sink and the second surface of the pad and is enabled access between the heat sink and the second surface through protruding features disposed on the heat sink, the second surface, and/or some combination of the two. The protruding features are responsible for the spaced apart configuration of the heat sink and the second surface.

In another aspect of the invention, a method of packaging a semiconductor device is provided. The method initiates with affixing a die to a first surface of a die pad of a lead frame. The method includes wire bonding bond pads of the die to leads extending from the lead frame and disposing a heat sink over a second surface of the die pad such that a surface of the heat sink is spaced apart from a portion of the second surface and the surface of the heat sink contacts a different portion of the second surface. The die and the lead frame are encapsulated with a molding compound such that the molding compound fills a cavity defined between the surface of the heat sink and the portion of the second surface. The disposal of the molding compound between the heat sink and the second surface provides for enhanced structural integrity of the package as the package is better able to resist internal stresses due to heat expansion forces experienced by the package. In addition, the molding compound functions as an adhesive for the die pad and the heat sink.

Other aspects of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

The embodiments described herein provide a package architecture for an integrated circuit. It will be obvious, however, to one skilled in the art, that the present invention may be practiced without some or all of these specific details. In other instances, well known process operations have not been described in detail in order not to unnecessarily obscure the present invention.

The embodiments described herein provide for a package solution to address the internal stresses created through current wire bond packaging configurations with a dropped in heat sink. In the embodiments described below, a protruding feature either on the die paddle, the heat sink, or a combination of both, enables the molding compound to access the area between the die paddle surface and the heat sink surface. By filling the cavity created through the protruding feature with molding compound, the stresses on the package are better tolerated to provide for a lower failure rate.

Figure 1:
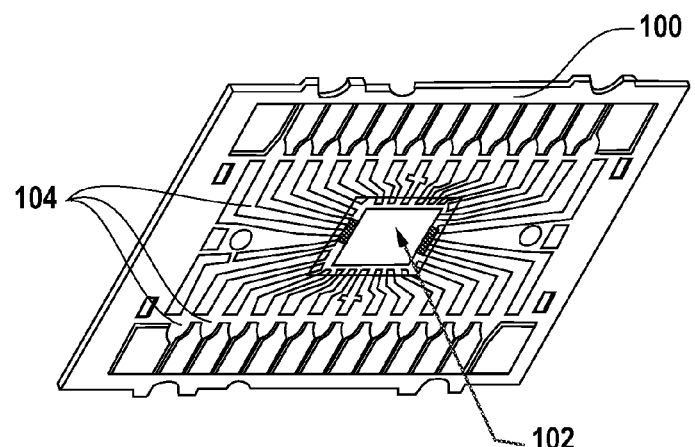
FIG. 1 is a simplified schematic diagram illustrating a lead frame in accordance with one embodiment of the invention.

FIG. 1 is a simplified schematic diagram illustrating a lead frame in accordance with one embodiment of the invention. Lead frame 100 is illustrated in a top planar view for exemplary purposes. One skilled in the art will appreciate that lead frame 100 may be stamped so that leads 104 are oriented on a different plane than die paddle 102. As explained in more detail below die paddle 102 may include protruding features on a surface opposing a dropped in heat sink. In an alternative embodiment the dropped in heat sink may include protruding features in order to be spaced apart from the opposing surface of die paddle 102. It should be appreciated that the embodiments may include protruding features on both the surface of die paddle 102 and the heat sink. Accordingly, the embodiments described herein that are not meant to be limiting as they are exemplary. In addition, numerous other lead frame configurations are capable of being implemented with the embodiments described herein as FIG. 1 is only one exemplary configuration that is not meant to be limiting.

Figure 2:
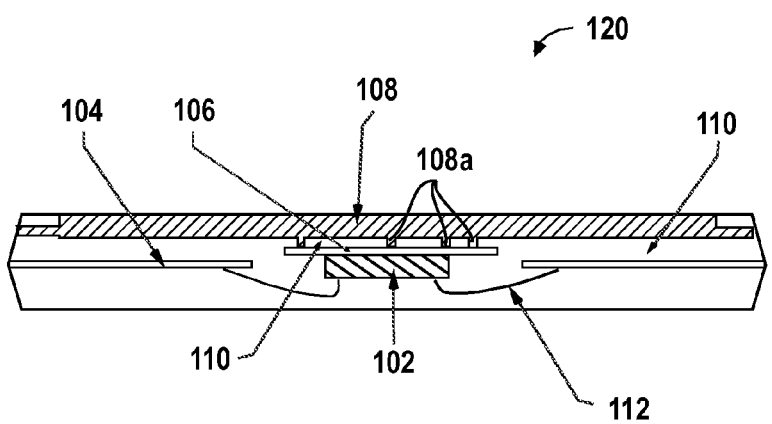
FIG. 2 is a simplified schematic diagram illustrating a cross-sectional view of a package configuration for an integrated circuit in accordance with one embodiment of the invention.

FIG. 2 is a simplified schematic diagram illustrating a cross-sectional view of a package configuration for an integrated circuit in accordance with one embodiment of the invention. Package configuration 120 includes die 102 being wire bonded to leads 104 of the lead frame. The lead frame includes die paddle 106 which may or may not be connected to leads 104. Die 102 is wire bonded to leads 104 through wires 112. Heat sink 108 is disposed in an offset manner from die paddle 106. One skilled in the art will appreciate that heat sink 108 is dropped into the package configuration in one embodiment. Mold compound 110 is utilized to encapsulate die 102 and the lead frame. In one embodiment, mold compound 110 is provided through an injection molding process. Heat sink 108 includes protruding features 108a. Protruding features 108a extend from a surface of heat sink 108 opposing a surface of die paddle 106. In one embodiment, protruding features 108a extend from the surface of heat sink 108 between about $5/1000$ and about $10/1000$ of an inch. Consequently, a gap or cavity is created between a surface of heat sink 108 and die paddle 106. Thus, as the mold compound 110 is injected into the package, the mold compound is able to fill the gap or cavity created through the protruding feature. It should be appreciated that die 102 may be any suitable integrated circuit, such as a microprocessor, programmable logic device, etc.

Figure 3:
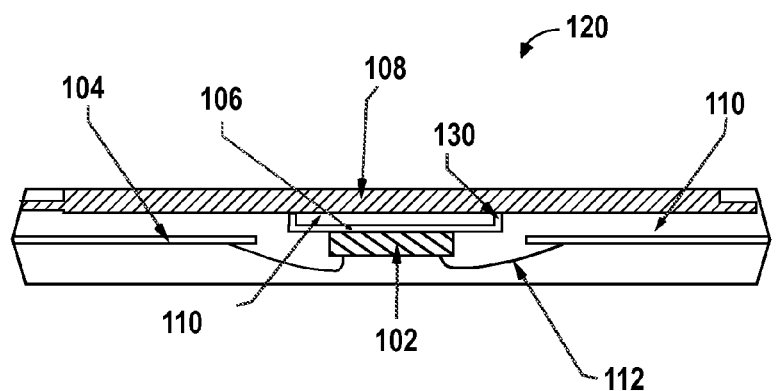
FIG. 3 is a simplified schematic diagram illustrating a cross-sectional view of a package configuration for an integrated circuit in accordance with an alternate embodiment of the invention.

FIG. 3 is a simplified schematic diagram illustrating a cross-sectional view of a package configuration for an integrated circuit in accordance with an alternate embodiment of the invention. Package configuration 120 includes die 102 wire bonded to leads 104 of the lead frame through wires 112. Heat sink 108 is disposed in an offset manner from die paddle 106. As mentioned above, heat sink 108 may be dropped into the package configuration in one embodiment. Mold compound 110 is utilized to encapsulate die 102 and the lead frame. In one embodiment mold compound 110 is provided through a transfer molding process. Die paddle 106 includes protruding features 130. Protruding features 130 extend from a surface of die paddle 106 opposing a surface of heat sink 108. In one embodiment protruding features 130 extend from the surface of die paddle 106 between about $5/1000$ and about $10/1000$ of an inch. Consequently, a gap or cavity is created between a surface of heat sink 108 and die paddle 106, into which mold compound 110 is injected. It should be appreciated that the placement of the protruding features in FIGS. 2 and 3 is exemplary and not meant to be limiting. That is, the protruding features may be placed along an outer periphery of die paddle 106, a centrally located region of die paddle 106, or a combination of the two. The same placement availability applies to protruding features of heat sink 108 also. In addition, the protruding features may be placed on a combination of heat sink 108 and die paddle 106. One skilled in the art will appreciate that the materials of composition for the molding compound, the heat sink, and the lead frame may be any material utilized for IC packages.

Figure 4A:
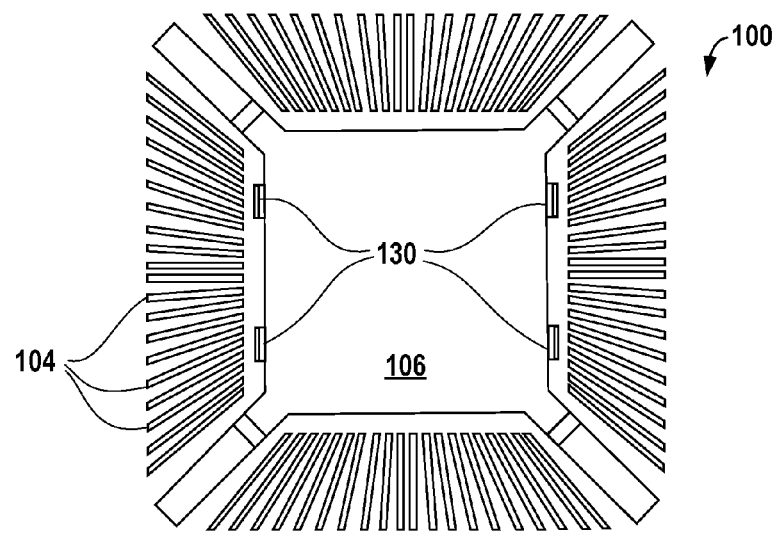
FIGS. 4A and 4B are simplified schematic diagrams illustrating alternate views of a lead frame having protruding features according to one embodiment of the invention.
Figure 4B:
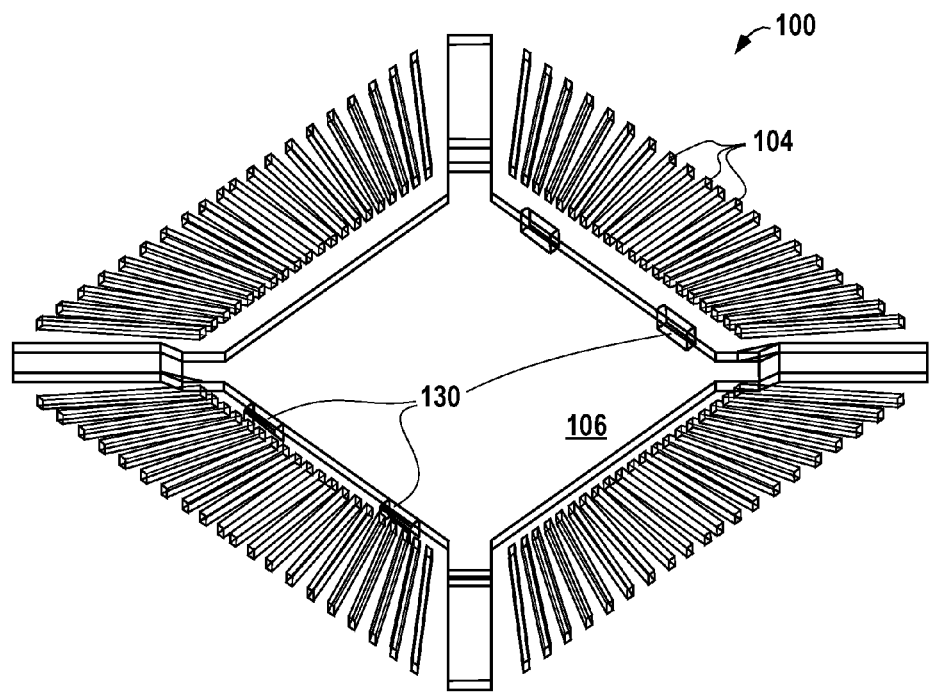

FIGS. 4A and 4B are simplified schematic diagrams illustrating alternate views of a lead frame having protruding features according to one embodiment of the invention. FIG. 4A is a Top view, while FIG. 4B is a top perspective view. Leads 104 extend from die paddle 106 of lead frame 100 in one embodiment. Leads 104 may not be connected to the die paddle in one embodiment. Protruding feature 130 is illustrated extending from the surface of die paddle 106. In this embodiment, two pairs of protruding features 130 are illustrated extending from a peripheral region of opposing sides of die paddle 106. One skilled in the art will appreciate that a heat sink having protruding features extending toward the die paddle surface may mate with the lead frame of FIGS. 4A and 4B in one embodiment. As mentioned above, leads 104 and die paddle 106 may be oriented along different planes. This orientation may be accomplished through a stamping process in one embodiment.

Figure 5A:
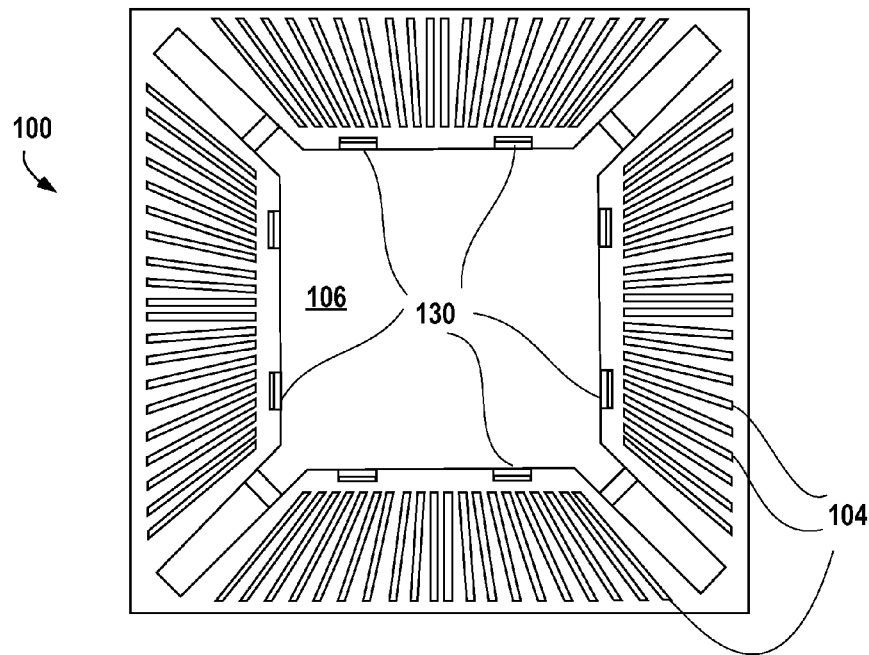
FIGS. 5A and 5B are simplified schematic diagrams illustrating alternate views of a lead frame having protruding features for an embodiment varied from the embodiment of FIGS. 4A and 4B.
Figure 5B:
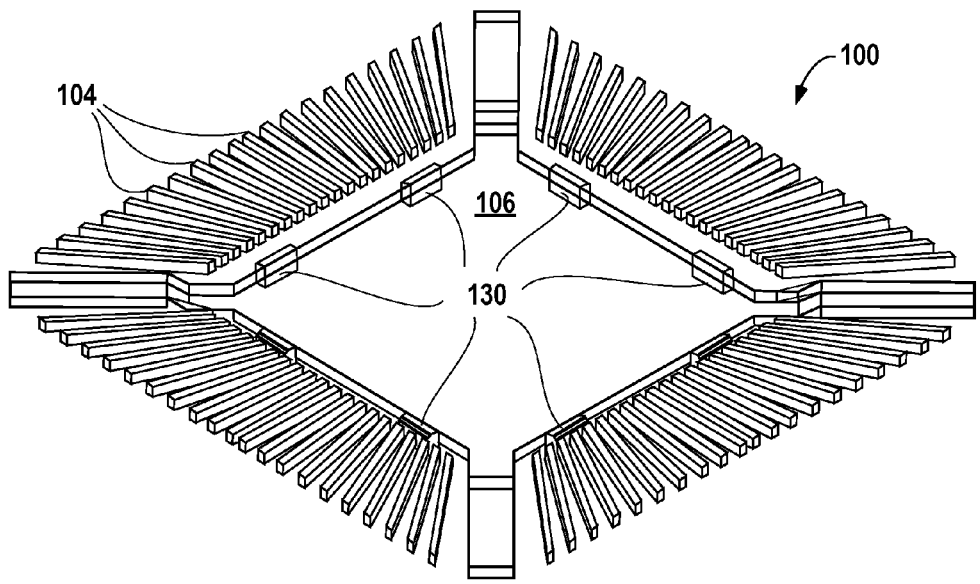

FIGS. 5A and 5B are simplified schematic diagrams illustrating alternate views of a lead frame having protruding features for an embodiment varied from the embodiment of FIGS. 4A and 4B. FIG. 5A is a top view, while FIG. 5B is a top perspective view. Leads 104 extend from die paddle 106 of lead frame 100 in one embodiment. Protruding features 130 are illustrated extending from the surface of die paddle 106. In this embodiment, four pairs of protruding features 130 are illustrated extending from a peripheral region of each of the sides of die paddle 106. One skilled in the art will appreciate that a heat sink having protruding features extending an equivalent amount from the surface of the heat sink toward different regions of the die paddle surface from where protruding features 130 extend may mate with the lead frame of FIGS. 5A and 5B, in one embodiment.

Figure 6:
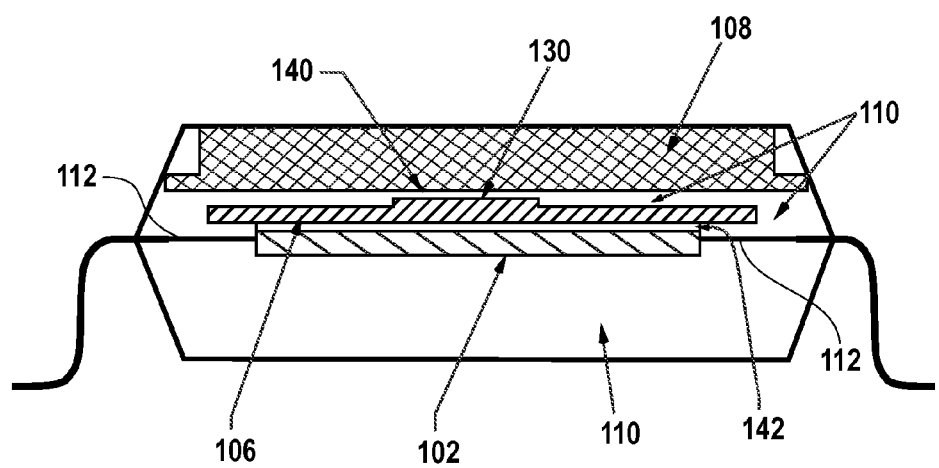
FIG. 6 is a simplified schematic diagram illustrating a package configuration having a centrally located offset on a die paddle surface in accordance with one embodiment of the invention.

FIG. 6 is a simplified schematic diagram illustrating a package configuration having a centrally located offset on a die paddle surface in accordance with one embodiment of the invention. Die 102 is disposed onto a surface of die paddle 106. Die 102 is wire bonded to leads of the lead frame through wires 112. Die paddle 106 is configured to have a centrally located protrusion 130 extending from a surface of die paddle frame 106 that opposes the surface onto which die 102 is mounted. It should be appreciated that die 102 is affixed to the surface of die paddle 106 through epoxy 142. The centrally located protrusion 130 provides for a spaced apart configuration between a surface of heat sink 108 and die paddle 106. After dropping in heat sink 108 and upon transfer molding, mold compound 110 is able to penetrate into the gap created through the centrally located protrusion 130. That is, the spaced apart configuration between the surface of heat sink 108 and die paddle 106 is now filled with mold compound in order to provide enhanced structural integrity to the package. It should be appreciated that a relatively small area between centrally located protrusion 130 and the surface of heat sink 108 will preclude the mold compound 110 from penetrating. This area is represented by gap 140. However, since the surface of the centrally located protrusion against the heat sink is significantly reduced, the impact of any expansion forces becomes negligible.

Figure 7:
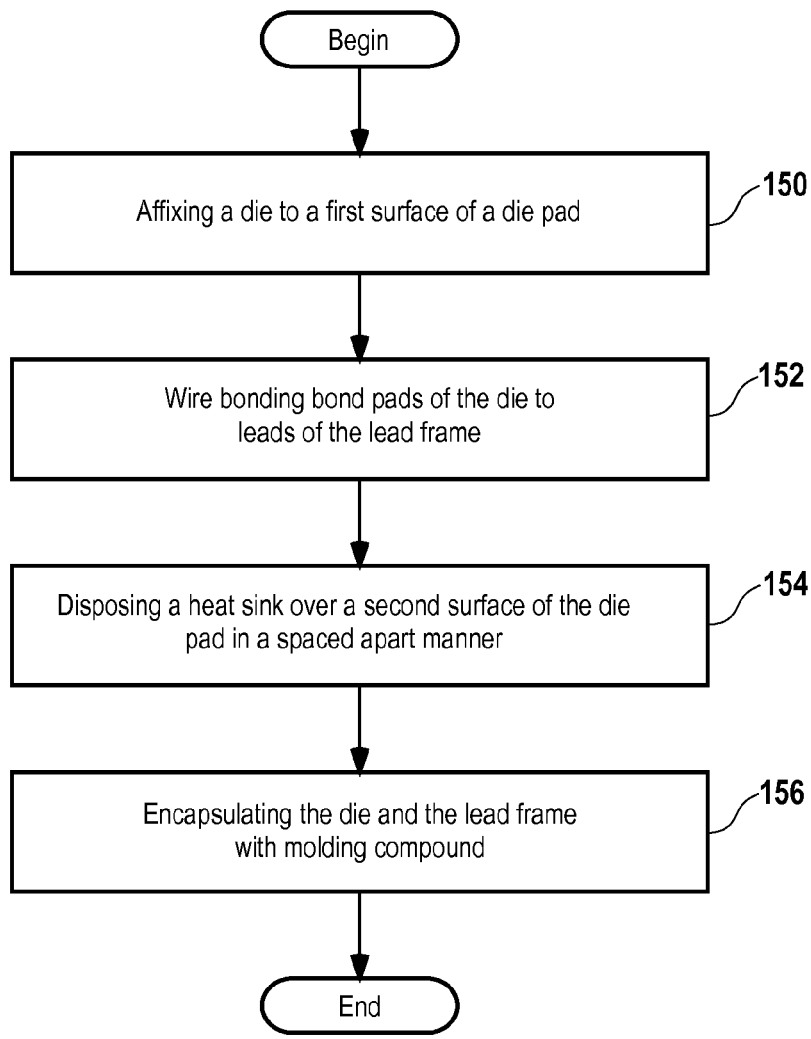
FIG. 7 is a flowchart diagram illustrating the method operations of packaging a semiconductor device in accordance with one embodiment of the invention.

FIG. 7 is a flowchart diagram illustrating the method operations of packaging a semiconductor device in accordance with one embodiment of the invention. The method initiates with operation 150 where a die is affixed to a first surface of the die pad. As noted above, the die may be affixed to the surface of the die paddle of the lead frame through epoxy. The method proceeds to operation 152 where the bond pads of the die are wire bonded to the leads of the lead frame. One skilled in the art will appreciate that any known technique for wire bonding may be utilized in this operation. The method advances to operation 154 where a heat sink is disposed over a second surface of the die paddle in a spaced apart manner. In operation 154 the heat sink may be dropped-into the package. As mentioned above, the heat sink may have protruding features that enable the spaced apart configuration illustrated in FIGS. 2, 3, and 6. Alternatively the die paddle, surface may have protrusions or protruding features extending therefrom. In addition, both the die pad surface and the heat sink may have the protruding features. The method then continues to operation 156 where the die and the lead frame are encapsulated with molding compound. It should be appreciated that the molding compound may be injected through a transfer molding procedure known in the art.

In summary, the embodiments provide for a package for an integrated circuit having a surface of the die pad and a surface of a heat sink spaced apart through protruding features in order to enable access of the molding compound between the heat sink and the die paddle. The presence of the molding compound in the gap created by the spaced apart configuration provides for enhanced structural integrity of the package, as opposed to the previous technique of dropping in the heat sink against the surface of the die pad and precluding molding compound between the surfaces. The molding compound utilized by the embodiments may be any suitable molding compounds known in the art, such as epoxy resins, etc.

The programmable logic device described herein may be part of a data processing system that includes one or more of the following components; memory; logic circuit; I/O circuitry; and peripheral devices. The data processing system can be used in a wide variety of applications, such as computer networking, data networking, instrumentation, video processing, digital signal processing, or any suitable other application where the advantage of using programmable or reprogrammable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

As used herein programmable logic devices refer to any integrated circuit that may be programmed to perform a desired function and include programmable logic arrays (PLAs), programmable array logic (PAL), field programmable gate arrays (FPGA), complex programmable logic devices (CPLDs), and a wide variety of other logic and memory devices that may be programmed. Often, such PLDs are designed and programmed by a design engineer using an electronic design automation tool that takes the form of a software package.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. An integrated circuit (IC) package, comprising:
    a lead frame having a pad with an opposed first surface, a uniform planar second surface, and a plurality of sides, wherein a plurality of protruding features extend from the uniform planar second surface of the pad, at least two of the plurality of protruding features extend from a peripheral region of each side of the plurality of sides of the pad, and the plurality of protruding features and the pad are portions of the lead frame;
    a die affixed to the opposed first surface of the pad of the lead frame, wherein the die is wire bonded to the lead frame;
    a heat sink, distinct from the lead frame, spaced apart from the pad by the plurality of protruding features of the lead frame, the heat sink contacting the plurality of protruding features; and
    a molding compound encapsulating the lead frame and the die, wherein a portion of the molding compound is disposed between the heat sink and the uniform planar second surface of the pad at a central region of the pad.

2. The IC package of claim 1, wherein the die is wire bonded to a surface of leads of the lead frame, the surface of the leads opposing the uniform planar second surface.

3. The IC package of claim 2, wherein a plane of the opposed first surface of the pad is offset from a plane of the surface of the leads.

4. The IC of claim 1, wherein the heat sink includes a plurality of protrusions extending from a surface of the heat sink opposing the uniform planar second surface of the pad, wherein the plurality of protrusions extend toward the uniform planar second surface.

5. The IC of claim 2, wherein the opposed first surface of the pad is offset from a plane of the surface of the leads.

6. The IC of claim 1, wherein an additional protrusion extends from an inner portion of the uniform planar second surface of the pad outward toward the heat sink.

7. The IC of claim 6, wherein a top surface of the additional protrusion supports the heat sink such that the heat sink is spaced apart from an outer portion of the uniform planar second surface.

8. The IC of claim 1, wherein a distance between a surface of the heat sink and the uniform planar second surface is between about 5 thousandths of an inch and about 10 thousandths of an inch.

9. A discrete lead frame for an integrated circuit package, comprising:
    a die pad area having a first surface for affixing a die;
    a plurality of lead frame extensions extending from the die pad area, the plurality of lead frame extensions disposed along a planar surface different than a planar surface of the die pad area;
    a plurality of protruding features of a second surface of the die pad area, the second surface smooth and flat and opposing the first surface, wherein the plurality of protruding features extend from the second surface, at least two of the plurality of protruding features extend from a peripheral region of each side of a plurality of sides of the die pad area, and the plurality of protruding features creates a gap, at a centrally located region of the die pad area, between the second surface and a heat sink; and
    the heat sink distinct from the discrete lead frame, wherein the heat sink contacts the plurality of protruding features of the discrete lead frame such that the heat sink is disposed in an offset manner from the second surface and the gap is filled with a mold compound.

10. The discrete lead frame of claim 9, wherein the plurality of protruding features is located along an outer periphery of the second surface.

11. The discrete lead frame of claim 9, wherein an additional protrusion extends from a centroid of the second surface.

12. The discrete lead frame of claim 11, wherein the additional protrusion has a height of between about 5 thousandths of an inch and about 10 thousandths of an inch.

13. A method of packaging a semiconductor device, said method comprising:
    affixing a die to a first surface of a die pad of a lead frame;
    wire bonding bond pads of the die to leads extending from the lead frame;
    disposing a heat sink over a second surface of the die pad such that the heat sink is spaced apart from the second surface and a surface of the heat sink is brought into contact with a plurality of protrusions extending from the second surface, wherein at least two of the plurality of protrusions extend from a peripheral region of each side of a plurality of sides of the die pad; and
    encapsulating the die and the lead frame with a molding compound such that the molding compound fills a cavity defined between the surface of the heat sink and the second surface, at a centrally located region of the die pad.

14. The method of claim 13, wherein the heat sink includes a plurality of protrusions extending from the surface of the heat sink.

15. The method of claim 13, wherein the plurality of protrusions extend from an outer periphery of the second surface.

16. The method of claim 13, wherein the semiconductor device is a programmable logic device.

17. The method of claim 13, wherein the cavity is between about 5 thousandths of an inch and about 10 thousandths of an inch.

18. The method of claim 13, wherein the leads extending from the lead frame are defined along a planar surface different than the first surface of the die pad.

19. The discrete lead frame of claim 9, wherein the plurality of protrusions is located on opposing sides of the die pad area.

\* \* \* \* \*